Inventors,
VICTOR J. COX
RAYMOND J. D. REEVES
By
by Mead, Browne, Schuyler & Beveridge
Attorneys June 25, 1957 V. J. COX ET AL 2,797,325

AUTOMATIC FREQUENCY CONTROL SYSTEMS

Filed Oct. 14, 1954 4 Sheets-Sheet 2

Inventors
VICTOR J. COX
RAYMOND J. D. REEVES
By
Mead, Browne, Schuyler & Beveridge
Attorneys

AUTOMATIC FREQUENCY CONTROL SYSTEMS

Filed Oct. 14, 1954 4 Sheets-Sheet 3

Inventors
VICTOR J. COX
RAYMOND J. D. REEVES
By
Mead, Browne, Schuyler & Beveridge
Attorneys June 25, 1957 V. J. COX ET AL 2,797,325

AUTOMATIC FREQUENCY CONTROL SYSTEMS

Filed Oct. 14, 1954 4 Sheets-Sheet 4

Inventors
VICTOR J. COX
RAYMOND J.D. REEVES
By Ward, Browne, Schuyler & Beveridge
Attorneys 2,797,325

AUTOMATIC FREQUENCY CONTROL SYSTEMS

Victor J. Cox, Brinkworth, and Raymond J. D. Reeves, Chippenham, England, assignors to E. K. Cole Limited, Southend-on-Sea, England Application October 14, 1954, Serial No. 462,326

Claims priority, application Great Britain October 20, 1953

4 Claims. (Cl. 250—36)

Figure 1:
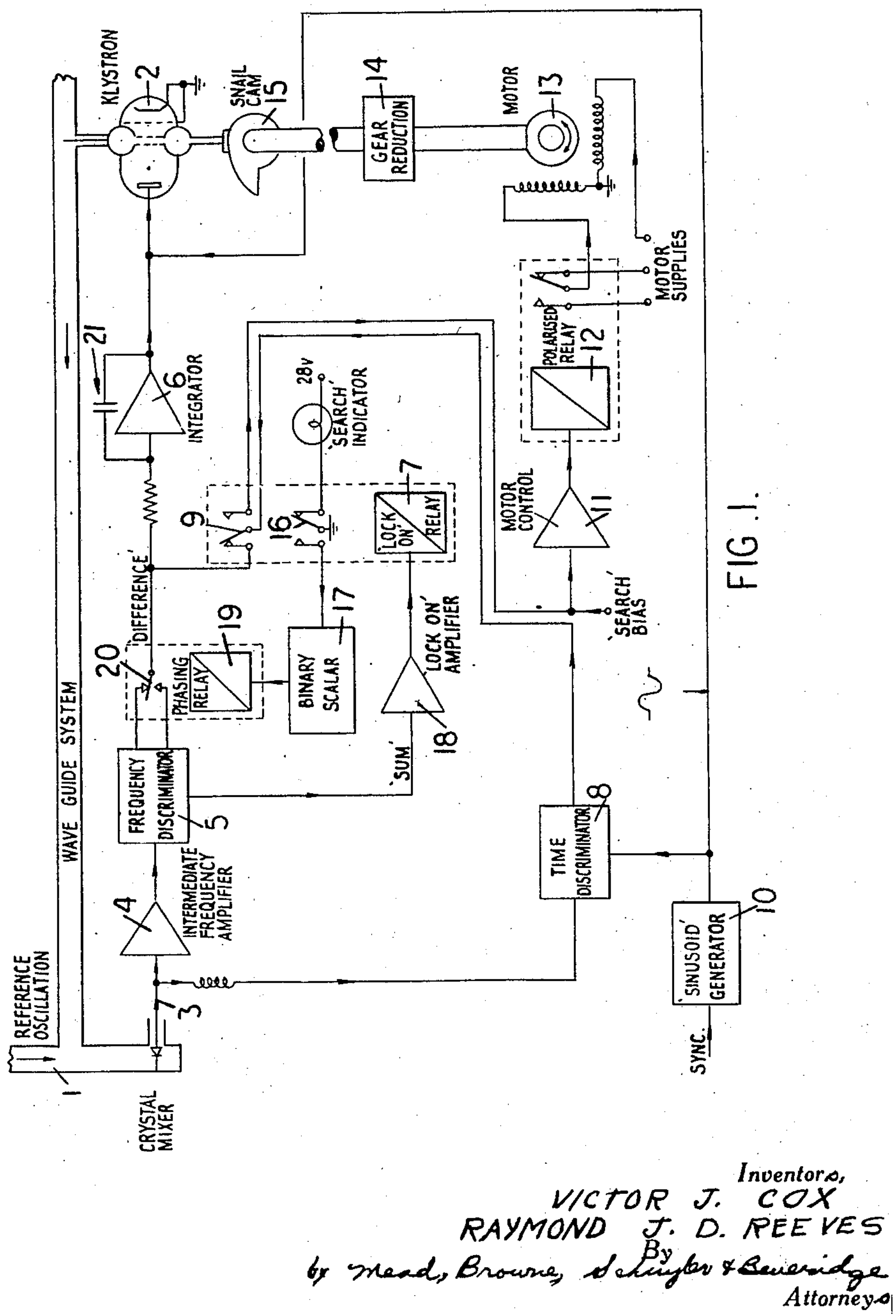

This invention relates to automatic frequency control of klystron oscillators of the reflex type.

As is known, the frequency of oscillation of such a klystron oscillator depends upon the voltage on the reflector and the effective size of the cavity.

A feature of the klystron oscillator is its capability of oscillating in a plurality of modes, which are separated by regions of no oscillation. It is usually convenient to work the klystron always in one particular predetermined mode and when we refer to the tuning range of the reflector we mean the range of reflector voltage spanned by the mode at a given cavity setting.

An automatic frequency control means must bring and maintain the oscillator to the prescribed frequency and for optimum operation be able to adjust and maintain the klystron within a mode of oscillation.

Usually a frequency discriminator is used to maintain these conditions when the klystron is within a relatively small degree of tune—this condition is usually referred to as a "follow condition." When the error is so great that it cannot be handled by the frequency discriminator additional means have been brought into effect to reduce this error. This condition is usually called the "search condition."

The meaning of "follow" and "search" condition whenever referred to hereinafter has the above meaning.

An automatic frequency control of the above type has been proposed to adjust the reflector voltage from a frequency discriminator fed from the klystron oscillator and from a reference frequency and also to adjust the cavity of the klystron to bring and keep it in a predetermined mode of oscillation. In such previous system the means have provided for the setting and maintaining of the mean reflector voltage such that the klystron oscillator amplitude (power) was a maximum. This has a defect, for often the maximum amplitude does not occur at the centre of the mode and as a result the available tuning range about the mean reflector voltage is asymmetrical and restricted on one side of that mean voltage. This imposes a restriction on the high speed of tracking of frequency errors.

Whenever "the centre of a mode" is hereinafter referred to we mean at that ordinate in the mode about which areas enclosed by the curve connecting amplitude and reflector voltage, are equal.

An object of the invention is an improved control system automatic in operation, in which the klystron oscillator will oscillate at the centre of a mode at a frequency which is a prescribed fixed frequency difference from the frequency of a reference oscillator, this irrespective of changes in the circuit conditions, e. g. temperature, supply voltages etc.

A feature of the present invention is a control system of said type in which an error signal from a frequency discriminator is made to operate (continuously, except for brief periods of time) the reflector control of a klystron adapted to oscillate in a predetermined mode, in such a way as to reduce that error, in said brief periods the reflector being used for mapping the mode shape on to a time scale whereby a time discriminator may determine the displacement of the reflector voltage from the mode centre, such displacement being corrected by a servomotor operating comparatively slowly on the klystron cavity control, the mapping wave form being substantially large (but not such as to bring the klystron on to adjacent modes), in order to effect mode centering even if the reflector voltage were initially such that the klystron were off the prescribed mode.

According to a further feature of the invention, in the system above stated should the difference between the reference frequency and the klystron oscillation frequency differ by an amount greater or less than the required difference which amount is greater than can be indicated by the frequency discriminator, a relay is operated causing an electromechanical transducer to vary periodically the cavity tuning over a relatively large frequency range, said relay also modifying the circuit so that the output of the aforesaid time discriminator controls the reflector voltage in such a way as to ensure oscillation of the klystron irrespective of reasonable variations of valve characteristics and change in reflector voltage required to maintain oscillation as the cavity adjustment is taking place.

A still further feature of the invention is, in either of the features expressed above, an arrangement in which a relay controlling the cavity adjustment is caused to operate a binary scaler which reverses the sense of the frequency discriminator error signals for the alternate operations of the relay in order that the klystron may oscillate at the predetermined frequency difference above or below that of the reference oscillation.

Figure 2A:
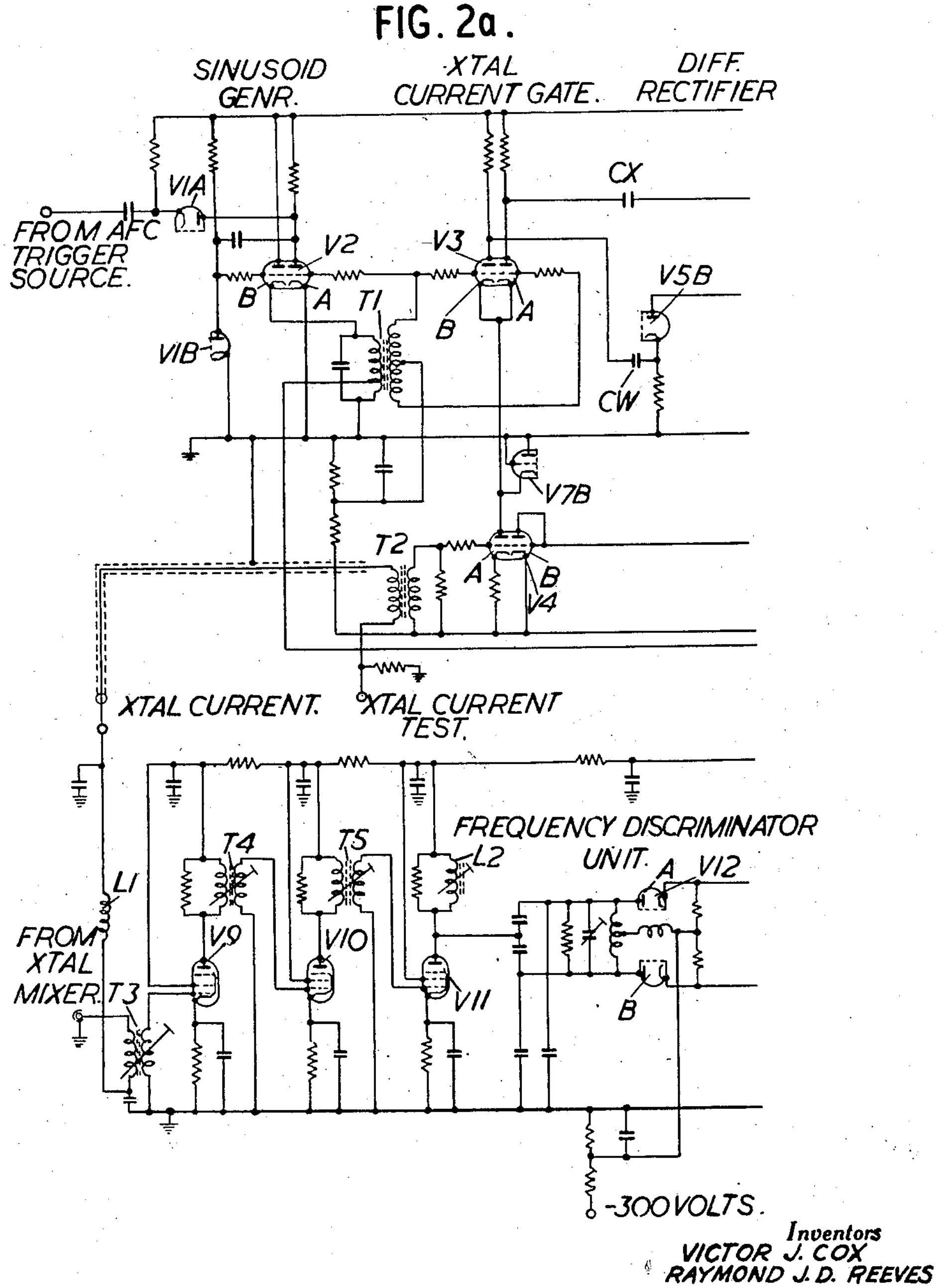
Figure 2B:
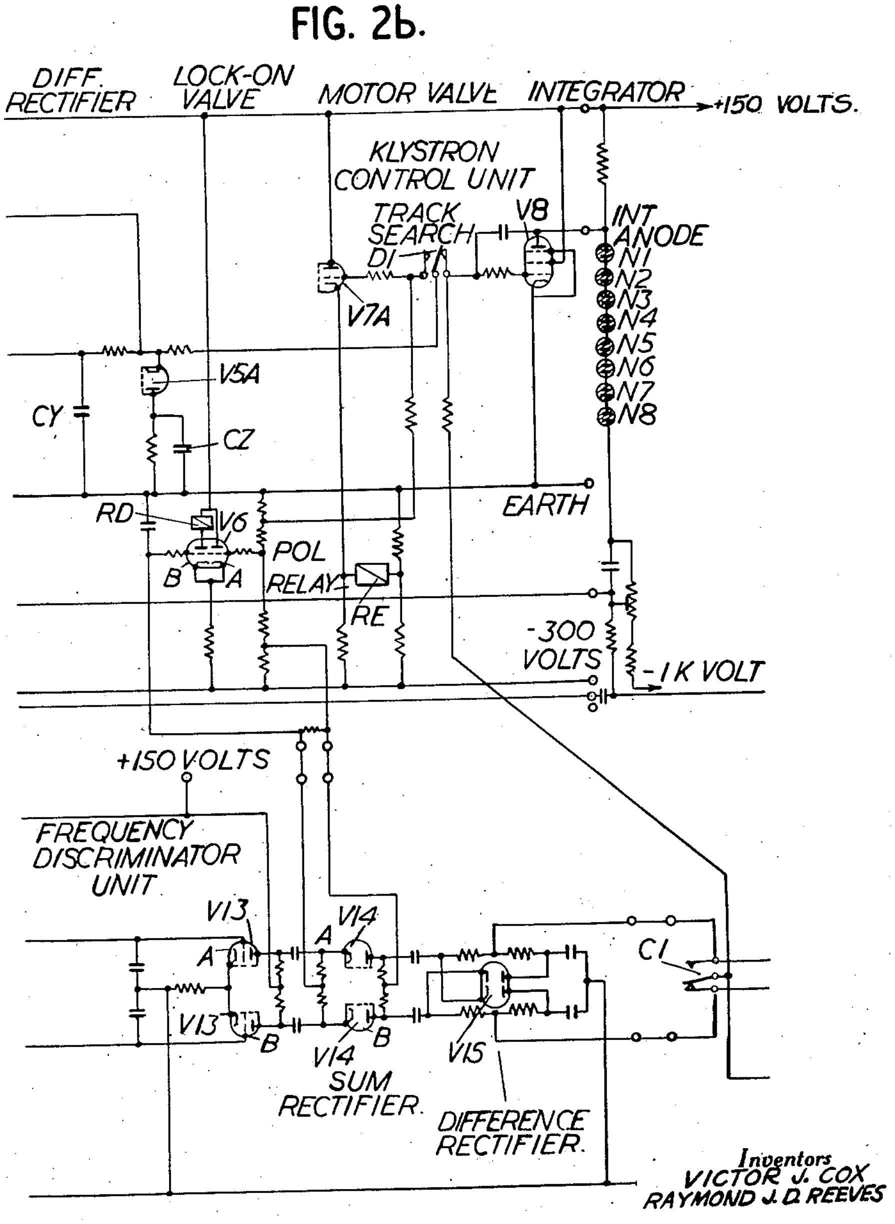
Figure 2C:
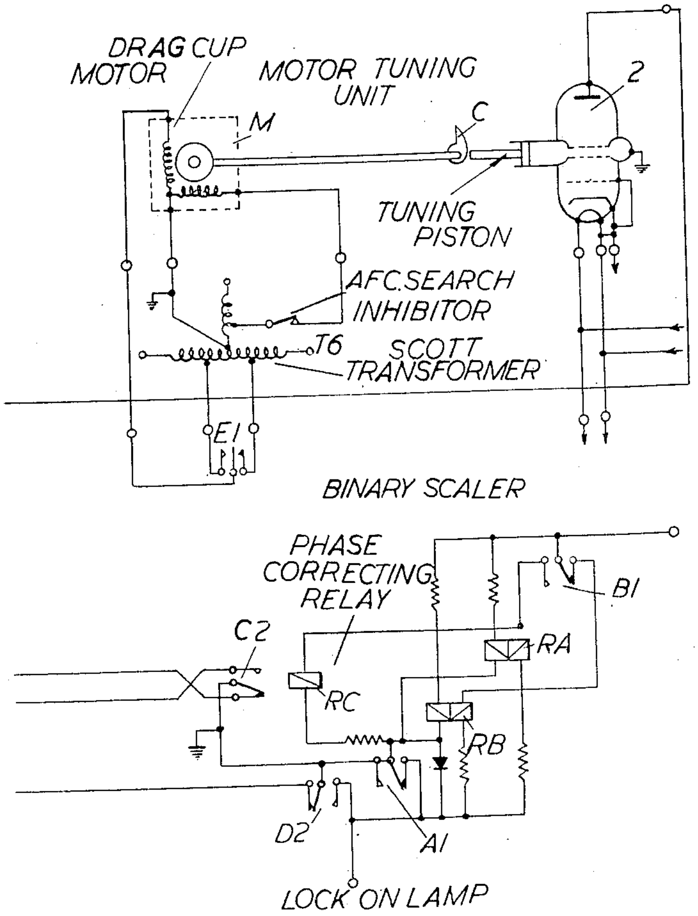

The above and other features of the invention will be more readily understood by a perusal of the following description, having reference to the accompanying drawings in which Figure 1 is a block schematic diagram of one form of the invention and Figures 2A, 2B and 2C together illustrate a circuit diagram of the apparatus of Figure 1.

With reference to Figure 1, a source of reference oscillation is introduced into the circuit at 1. This is mixed with oscillations from a klystron 2 and from a crystal mixer a predetermined intermediate frequency (I. F.) appears in the leads 3. This I. F. is amplified in an amplifier 4 and is fed to a frequency discriminator 5 so that "difference" frequencies are fed to an integrator 6 which controls the voltage on the reflector of the klystron 2. "Sum" frequencies from the discriminator 5 are amplified in an amplifier 18 and used to control the operation of a "lock-on" relay 7. A shunt path from the leads 3 comprises a time discriminator 8 connected with a moving contact 9 of the lock-on relay. The time discriminator 8 is also fed from a "sinusoid" mapping waveform generator 10. When the relay 7 is operated it closes the circuit of the time discriminator 8 through a motor control 11 which operates a polarised relay 12 whose contacts control the supply current to a motor 13. This motor through suitable reduction gears 14 causes the rotation of a snail cam 15 which in operation governs the cavity size of the klystron. The lock-on relay 7 has another moving contact 16 which operates a binary scaler 17 which through a phasing relay 19 controls the poistion of a switch 20 in the output of the frequency discriminator 5.

The operation of the system is as follows:

If on switching on, the klystron is well off a mode, there will be no I. F. input to the discriminator 5 and the lock-on relay 7 will be de-energised and its contacts will be in the positions shown in the drawing. Under these conditions the reflector of the klystron will be at a mean voltage determined by the charge on the integrating condenser (21 on the drawing). This voltage is set by the design conditions to be within say 15 volts of the edge of a mode. The mapping waveform is a single sine wave of say 30 volts peak to peak amplitude occurring before the reference pulse from 1 (or alternatively running asynchronously therewith), and this waveform is A. C. coupled to the reflector. This waveform will sweep the reflector through part or all of its mode. The resulting crystal current fluctuations are A. C. coupled into a time discriminator 8 and the resulting D. C. output is fed via contact 9 to the integrator 6. The sense of this output is such as to move the mean D. C. level of the reflector towards the centre of the mode. The resulting voltage will not necessarily correspond with the maximum output of the klystron if the klystron has an asymmetric mode but will settle down to a point on the mode such that the areas on each side are approximately equal.

As the contacts of the lock-on relay 7 are in the position shown, the resonator tuning motor control is connected only to a "search" bias, and this rotates the snail cam 15 at a rate of say 5 revs. per minute. During this operation the optimum reflector voltage will change but the crystal current circuit will keep the reflector at this optimum voltage. At some time in this search cycle, the klystron will oscillate at a frequency equal to the difference between the transmitter frequency and the prescribed I. F. frequency. There will then be an input to the discriminator 5. This input will cause, via the amplifier 18, the operation of the lock-on relay 7 whose movable contacts move to their alternative contacts. The reflector will now be connected to the output of the difference rectifier in 5 and the motor 13 to the output of the crystal current servo. Under these conditions, output from the discriminator 5 will adjust the reflector voltage for the correct output frequency. If on this correct output frequency, the reflector is in the middle of its mode, there will be no output from the time discriminator 8 and the resonator tuning motor will be stationary. If the motor has overshot, the voltage taken up by the reflector for correct output frequency will not be in the centre of the mode and the output from the time discriminator will move the motor shaft. This will change the resonator tuning and hence the output frequency of the klystron and this frequency change will be corrected by the discriminator output, thus involving a change in the reflector voltage. If it should happen that the klystron be oscillating on a suitable channel (i. e. not second channel) this change in reflector voltage will be in such a direction as to move the reflector nearer the centre of the mode.

The circuit will then stabilise with the motor stationary and the klystron in the centre of its mode.

Assuming for a moment the absence of the binary scaler and that instead of as above, the klystron was oscillating on the second channel. In this case the sense of the discriminator 5 output will be reversed and will shift the klystron frequency until the beat output frequency is on one of the skirts of the discriminator response curve. Under these conditions the input to the sum rectifier is insufficient to energise the lock-on relay 7 which will result in lock-on instability before allowing the motor search to continue until the other channel is reached. An improvement on such an operation is provided by means of the circuit of the binary scaler 17 by which the balanced outputs from the discriminator always provide a difference frequency output which is correctly phased for successful operation of the control. The binary scaler observes the history of the lock-on relay and operates the phasing relay at half the rate of the lock-on relay, so that alternate difference outputs are selected for successive operations of the lock-on relay. In the event of locking on with the phasing incorrect, then "evasive" operation of the electronic part of the servo system results in the control device being temporarily thrown out of lock. Immediate relocking then occurs but with the phase now corrected by the phasing relay.

The binary scaler may take one of many forms, either electronic or electromagnetic, but considering the unstabilised nature of the supplies a relay scaler is to be preferred.

From the preceding description the general features of the invention will be understood. In order to show details of how the invention may be put into practical effect the circuit diagram of Figures 2A, 2B and 2C will now be described. The circuit is the present preferred embodiment of the invention but is not to be regarded as a limitation, as clearly, detail modifications may be made without exceeding the invention. Where a relay operates one pair of contacts, e. g. relay RA, its contacts are marked A1. Where a relay, e. g. RD, operates two pairs of contacts its contacts are marked D1 and D2 and so on.

Where a double valve is used, one part will be given a reference A and the other B, e. g. in V1 one part is referred to as V1A and the other part as V1B.

*Sinusoid generator*

An external trigger pulse of negative polarity will pass through the diode V1A and arrive at the grid of V2B, and thereby shut off the current that is normally flowing in the primary of the tuned transformer T1. The consequent sinusoidal ringing waveform that develops across T1 is coupled back from the secondary to the grid of V2 to assist the trigger pulse and prevent current flowing in V2B again until one complete cycle of the ringing waveform has elapsed. The absence of any negative trigger waveform at the commencement of the second ringing period will ensure that current does flow in V2B at this instant and so produce a low impedance at the cathode of V2B which heavily damps the tuned circuit and abruptly terminates the ring. A single cycle waveform is, therefore, generated and this is referred to as the sinusoid. 20 $\mu$secs. is a typical duration for this waveform.

*Time discriminator*

A fraction of the ringing waveform is picked off from the primary of T1 and fed to the reflector electrode of the klystron K. The resulting variations of oscillator strength in that valve, as observed from the current in a crystal detector which is coupled to 2 by a waveguide system, are fed to the input valve V4 of a gating circuit. The current in the crystal detector actually flows through the primary of T2 (with the exception of the R. F. components stopped by L1) and variations of this current appear as voltage output from the secondary which produces a proportional variation of anode current in V4A. The anode current of this valve normally flows through the diode V7B since the grids of V3 are returned through the secondary of T1 to a cut-off bias. However, when the sinusoid is generated first one grid and then the other of V3 will swing well positive with respect to earth and, therefore, divert the anode current of V4 to the valve with the positive grid, by shutting off the diode V7B. That is to say, at the very time the mean reflector potential of the klystron 2 is being modulated by the sinusoid, the crystal current levels are being diverted or "gated" into two channels, which can be identified either as the "early and late" or the "negative and positive" channels since they are associated with the first and second half periods of the sinusoid. The pulse currents that flow in these two channels pass through one or other of the diodes V5A, V5B and charge the condensers CW, CX, CY and CZ associated with this valve. The potentials that result are sufficient to prevent the diodes conducting between charging times, and in this relaxation period the condensers are able to discharge into each other. Since one condenser CX received its charge from the early channel and the other CY from the late channel, and since they are connected in series in the relaxation mesh, the potential at the cathode of V5A is proportional to the difference in the average crystal current observed during the positive reflector excursion and that during the negative excursion. This potential is a measure of how far the reflector setting is from the centre of the mode, it may be built up from many such measurements depending what leakage current from the cathode of V5A to earth is provided, but this is a factor affecting only the permissible speed of correction.

*Lock-on relay*

This mode "off centre" signal is connected to the switch on D1 of the lock-on relay RD whereby it may control either the tuning motor through valve V7A and polarised relay RE or the mean reflector potential through the Miller valve V8 and the neon chain N1–N8, according to the state of the relay armature.

*Frequency discriminator*

The detector crystal current also contains a beat frequency component at the difference between the klystron frequency and the reference oscillation frequency, and this develops a voltage across the resonant transformer T3 in the grid circuit of V9 if the beat frequency is near the resonant frequency of that transformer.

V9, V10, V11, with resonant transformers T3, T4, T5, and inductance L2 comprise further stages of selective amplification so that a beat frequency near the wanted intermediate frequency (I. F.) is amplified sufficiently to drive a frequency discriminator circuit which is a variety of a well known design. This is the circuit embracing and including V12.

The circuit shown here is designed for use with a pulsed transmitter and the frequency discriminator will produce video pulses at the grids of V13. The magnitude of each pulse as a function of the beat frequency is that of a resonance curve with a null at one side of the resonance and this null displaces the peak of the curve from the natural frequency away from the null. But the peak displacements at the two grids of V13 are in opposite directions so the effect is as if the pulses were produced by I. F. amplifiers of similar gain but occupying adjacent (and overlapping) channels. The anode currents in V13 are proportional to their respective grid pulse magnitudes, and charge all the condensers associated with V14 and V15. The potentials resulting from these charges prevent the diodes conducting between the transmitter firing instants, when the beat frequency is absent. The reverse potential that appears across V14 in the relaxation period is indicative of the fact that a beat frequency pulse (or many such pulses) have passed through the selective amplifier and, therefore, the klystron tuning is nearly correct. This steady signal is, therefore, applied between the two grids of V6 causing the lock-on relay RD to be energised and divert mode off centre signals to the motor valve V7A. The residual tuning error is now indicated by deriving a signal proportional to the difference in magnitude of the two pulses at the grids of V13. For this purpose the circuit of valve V13 functions in a similar way to that of V3. The condensers that are connected by resistors have received their charges from opposite anodes of V13, and the pick off junctions which are connected to the contacts C1 of RC assume a potential proportional to the difference in pulse magnitudes. It depends, however, on the state of the phasing relay RC which of these junctions is earthed and which is connected to the grid of V8 to constitute the tuning error signal, the only difference between them being the polarity of the signal that is developed for a given unbalance in pluse magnitude, i. e. a given tuning error. The lock-on relay RB has auxiliary contacts D2 which keeps the tuning error signals (if any) suppressed until the mode centering errors are diverted from V8.

*Binary scaler*

These contacts D2 also inject a "count" into a relay scaling circuit comprising scaling relays RA and RB and output relay RC. This known circuit, ensures that RC is related to the lock-on relay RD by a scale of two, i. e. RC operates at half the rate of RD. In this way successive lock-on operations find alternate control polarity existing. The sequence of events following the closure of the lock-on relay depends on the state of the phasing relay. If the loop is correctly phased the error signals from the frequency discriminator will change the klystron reflector voltage so as to reduce the tuning error, and the separate lock-on signal from the frequency discriminator will be sustained. If however the loop is incorrectly phased the reflector will be driven so as to increase the tuning error and the beat frequency will be mistuned to the edge of the frequency discriminator characteristic, and in this region the lock-on signal falls to a low value and the lock-on relay is de-energized. This puts the reflector under the control of the time discriminator which promptly restores it to the centre of the mode. This is the position at which lock-on previously occurred, and it occurs again, but this time with loop phase reversed by virtue of the count injected into the binary scaler by the lock-on relay unlocking.

*Motor tuning unit*

The motor M drives the cavity control has a four watt two phase stator and drag cup armature. The two phases are derived from a three phase supply by a Scott connected transformer T6. The motor valve V7A controls the current through a centre stable polarised relay RE whose contacts E1 connect one phase of the motor to one of two opposite polarities on one phase of the transformer. The quadrature reference phase is permanently connected except in special circumstances when it is desired to paralyse the motor. The bias on V7A is normally sufficient to keep the polarised relay energised and the motor turning in one direction, this search bias only being annulled by error signals from V5A and V5B to bring the motor to rest. The cavity control is automatically reset to the beginning of its stroke at the end of every search sweep by a stepped cam drive C.

The eight neon valves linking the Miller anode to the reflector electrode enable the D. C. output signal to be transferred to the klystron without excessive attenuation. The potential across these valves is largely independent of fluctuation of the supply voltages and there is an optimum potential that should be held stable in this way so that residual variations of all the supplies to the klystron combine to have approximately zero effect on the frequency of the klystron, and the control system merely has to handle the inaccuracies in this compensation process to nullify the effect of supply variations. For simplification in the drawing, the heater circuits for the valves are not shown.

What we claim is:

1. In an automatic frequency control for a reflex klystron oscillator for causing it to oscillate at a frequency which is a prescribed frequency difference with respect to a reference frequency, means for causing the reflector voltage to deviate periodically about a mean value, means for observing whether consequent variations in oscillator strength are symmetrical about a mode centre, a time discriminator for converting asymmetry in said variations to a steady control signal, means for applying said control signal to the reflector to correct its mean voltage, mechanical means for cyclically varying the oscillator frequency over a wide range, a crystal mixer detecting the difference frequency between the klystron oscillator and a pulsed reference oscillator, a difference frequency amplifier tuned to the prescribed difference frequency, a frequency discriminator connected to the said difference frequency amplifier, means for detecting the presence of the signal in the difference frequency amplifier, and switching means coupled to said detecting means to interrupt the cyclic mechanical sweep and divert the time discriminator output to control the said mechanical means and leaving the frequency discriminator output to control the reflector voltage.

2. In an automatic frequency control according to claim 1 a binary scaler observing the operation of the switching means, a phasing relay in the circuit of the binary scaler and switch contacts of the relay correcting the polarity of the error signal for shifting the reflector potential in a direction to bring the klystron nearer the required frequency.

3. In an automatic frequency control for a reflex klystron oscillator for maintaining the oscillations at a fixed frequency difference from a reference frequency, a klystron oscillator, a source of reference frequency, a frequency discriminator producing an output when the klystron oscillator varies from said fixed frequency by less than a predetermined amount, means for causing error signals from the frequency discriminator to control the voltage of the reflector of the klystron, switching means operated by an output of the frequency discriminator, a source of cyclically varying voltage whose magnitude is sufficient to swing the klystron substantially over a mode, means for impressing this voltage on the reflector of the klystron, means for deriving from the klystron variations in output due to this impression, a time discriminator, means for deriving from the last said output mode centering signals in the form of a voltage proportional to the degree the klystron oscillation is from the centre of a mode, means for impressing said voltage on the reflector of the klystron to substitute the said error signals, and means operated by said switching means to disconnect the said voltage from the klystron reflector, and connect the said voltage to an electromechanical transducer operating the klystron cavity control.

4. In an automatic frequency control according to claim 3 a binary scaler observing the operation of the switching means, a phasing relay in the circuit of the binary scaler and switch contacts of the relay correcting the polarity of the error signal for shifting the reflector potential in a direction to bring the klystron nearer the required frequency.

References Cited in the file of this patent

UNITED STATES PATENTS

| | | |
|---|---|---|
| 2,424,833 | Korman | July 29, 1947 |
| 2,462,856 | Ginzton | Mar. 1, 1949 |
| 2,464,818 | Learned | Mar. 22, 1949 |